(12) United States Patent
Wang

(10) Patent No.: US 11,662,980 B2
(45) Date of Patent: May 30, 2023

(54) IN-MEMORY ARITHMETIC PROCESSORS

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 822 days.

(21) Appl. No.: 16/675,554

(22) Filed: Nov. 6, 2019

(65) Prior Publication Data

US 2021/0132908 A1 May 6, 2021

(51) Int. Cl.
| | | |
|---|---|---|
| G06F 7/523 | (2006.01) | |
| G06F 7/50 | (2006.01) | |
| G11C 8/10 | (2006.01) | |
| G06F 1/03 | (2006.01) | |
| G06F 7/505 | (2006.01) | |

(52) U.S. Cl.
CPC .............. *G06F 7/523* (2013.01); *G06F 1/03* (2013.01); *G06F 7/50* (2013.01); *G06F 7/5057* (2013.01); *G11C 8/10* (2013.01)

(58) Field of Classification Search
CPC ....... G11C 8/10; G11C 8/16; G06F 1/03–035; G06F 7/4988; G06F 7/5057; G06F 2207/5354
See application file for complete search history.

(56) References Cited

U.S. PATENT DOCUMENTS

| | | | | |
|---|---|---|---|---|
| 4,566,075 A | * | 1/1986 | Guttag .................. | G06F 7/4915 708/620 |
| 6,101,522 A | * | 8/2000 | Sato ........................ | G06F 7/523 708/620 |
| 2006/0268626 A1 | * | 11/2006 | Hamzaoglu .............. | G11C 5/14 365/189.04 |
| 2019/0212980 A1 | * | 7/2019 | Malladi ............... | G06F 7/49936 |

OTHER PUBLICATIONS

U.S. Appl. No. 16/925,650, filed Jul. 10, 2020.

* cited by examiner

*Primary Examiner* — Matthew D Sandifer
(74) *Attorney, Agent, or Firm* — Muncy, Geissler, Olds & Lowe, P.C.

(57) ABSTRACT

In-memory arithmetic processors for the "n-bit" by "n-bit" multiplication, the "n-bit" by "n-bit" addition, and the "n-bit" by "n-bit" subtraction operations are disclosed. The in-memory arithmetic processors of the invention can obtain the operational resultant integer in the binary format for two inputted integers represented by two "n-bit" binary codes in one-step processing with no sequential multiple-step operations as for the conventional arithmetic binary processors. The in-memory arithmetic processors are implemented by a 2-dimensional memory array with X and Y decoding for the two inputted operational integers in the arithmetic binary operations.

18 Claims, 13 Drawing Sheets

Decimal Multiplication Table : C = A × B

| B \ A | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 0 | 0 | 0 | 0 |
| 1 | 0 | 1 | 2 | 3 | 4 | 5 | 6 | 7 | 8 | 9 |
| 2 | 0 | 2 | 4 | 6 | 8 | 10 | 12 | 14 | 16 | 18 |
| 3 | 0 | 3 | 6 | 9 | 12 | 15 | 18 | 21 | 24 | 27 |
| 4 | 0 | 4 | 8 | 12 | 16 | 20 | 24 | 28 | 32 | 36 |
| 5 | 0 | 5 | 10 | 15 | 20 | 25 | 30 | 35 | 40 | 45 |
| 6 | 0 | 6 | 12 | 18 | 24 | 30 | 36 | 42 | 48 | 54 |
| 7 | 0 | 7 | 14 | 21 | 28 | 35 | 42 | 49 | 56 | 56 |
| 8 | 0 | 8 | 16 | 24 | 32 | 40 | 48 | 56 | 64 | 72 |
| 9 | 0 | 9 | 18 | 27 | 36 | 45 | 54 | 63 | 72 | 81 |

Fig. 2 (Prior Art)

Decimal Addition Table: C = A + B

| B\A | 0 | 1 | 2 | 3 | 4 | 5 | 6 | 7 | 8 | 9 |
|---|---|---|---|---|---|---|---|---|---|---|
| 0 | 0 | 1 | 2 | 3 | 4 | 5 | 6 | 7 | 8 | 9 |
| 1 | 1 | 2 | 3 | 4 | 5 | 6 | 7 | 8 | 9 | 10 |
| 2 | 2 | 3 | 4 | 5 | 6 | 7 | 8 | 9 | 10 | 11 |
| 3 | 3 | 4 | 5 | 6 | 7 | 8 | 9 | 10 | 11 | 12 |
| 4 | 4 | 5 | 6 | 7 | 8 | 9 | 10 | 11 | 12 | 13 |
| 5 | 5 | 6 | 7 | 8 | 9 | 10 | 11 | 12 | 13 | 14 |
| 6 | 6 | 7 | 8 | 9 | 10 | 11 | 12 | 13 | 14 | 15 |
| 7 | 7 | 8 | 9 | 10 | 11 | 12 | 13 | 14 | 15 | 16 |
| 8 | 8 | 9 | 10 | 11 | 12 | 13 | 14 | 15 | 16 | 17 |
| 9 | 9 | 10 | 11 | 12 | 13 | 14 | 15 | 16 | 17 | 18 |

Fig. 3 (Prior Art)

| Decimal Subtraction Table: C = A - B | | | | | | | | | | |
|---|---|---|---|---|---|---|---|---|---|---|
| A / B | 0 | 1 | 2 | 3 | 4 | 5 | 6 | 7 | 8 | 9 |
| 0 | 0 | 1 | 2 | 3 | 4 | 5 | 6 | 7 | 8 | 9 |
| 1 | -1 | 0 | 1 | 2 | 3 | 4 | 5 | 6 | 7 | 8 |
| 2 | -2 | -1 | 0 | 1 | 2 | 3 | 4 | 5 | 6 | 7 |
| 3 | -3 | -2 | -1 | 0 | 1 | 2 | 3 | 4 | 5 | 6 |
| 4 | -4 | -3 | -2 | -1 | 0 | 1 | 2 | 3 | 4 | 5 |
| 5 | -5 | -4 | -3 | -2 | -1 | 0 | 1 | 2 | 3 | 4 |
| 6 | -6 | -5 | -4 | -3 | -2 | -1 | 0 | 1 | 2 | 3 |
| 7 | -7 | -6 | -5 | -4 | -3 | -2 | -1 | 0 | 1 | 2 |
| 8 | -8 | -7 | -6 | -5 | -4 | -3 | -2 | -1 | 0 | 1 |
| 9 | -9 | -8 | -7 | -6 | -5 | -4 | -3 | -2 | -1 | 0 |

Fig. 4 (Prior Art)

n-bit by n-bit Multiplication Table: C = A x B

| A \ B | 0<br>00..00..00b | 1<br>00..00..01b | ... | $2^{n-1}-1$<br>01..11..11b | ... | $2^n-2$<br>11..11..10b | $2^n-1$<br>11..11..11b |
|---|---|---|---|---|---|---|---|
| 0<br>00..00..00b | 0<br>00..00..00 00..00..00b | 0<br>00..00..00 00..00..00b | ... | 0<br>00..00..00 00..00..00b | ... | 0<br>00..00..00 00..00..00b | 0<br>00..00..00 00..00..00b |
| 1<br>00..00..01b | 0<br>00..00..00 00..00..00b | 1<br>00..00..00 00..00..01b | ... | $2^{n-1}-1$<br>00..00..00 01..11..11b | ... | $2^n-2$<br>00..00..00 11..11..10b | $2^n-1$<br>00..00..00 11..11..11b |
| ... | 0<br>00..00..00 00..00..00b | ... | ... | ... | ... | ... | ... |
| $2^{n-1}-1$<br>01..11..11b | 0<br>00..00..00 00..00..00b | $2^{n-1}-1$<br>00..00..00 01..11..11b | ... | $2^{2n-2}-2^n+1$<br>00..11..11 00..00..01b | ... | $2^{2n-1}-2^{n+1}+2$<br>01..11..10 00..00..10b | $2^{2n}-2^n-2^{n-1}+1$<br>01..11..10 10..00..01b |
| ... | 0<br>00..00..00 00..00..00b | ... | ... | ... | ... | ... | ... |
| $2^n-2$<br>11..11..10b | 0<br>00..00..00 00..00..00b | $2^n-2$<br>00..00..00 11..11..10b | ... | $2^{2n-1}-2^{n+1}+2$<br>01..11..10 00..00..10b | ... | $2^{2n}-2^{n+2}+2^2$<br>11..11..00 00..00..00b | $2^{2n}-2^{n+1}-2^n+1$<br>11..11..01 00..00..01b |
| $2^n-1$<br>11..11..11b | 0<br>00..00..00 00..00..00b | $2^n-1$<br>00..00..00 11..11..11b | ... | $2^{2n}-2^n-2^{n-1}+1$<br>01..11..10 10..00..01b | ... | $2^{2n}-2^{n+1}-2^n+1$<br>11..11..01 00..00..01b | $2^{2n}-2^{n+1}+1$<br>11..11..10 00..00..01b |

Fig. 5 n-bit by n-bit Addition Table : C = A + B

| A \ B | 0<br>00..00.00b | 1<br>00..00.01b | ... | $2^{n-1}-1$<br>01..11..11b | ... | $2^n-2$<br>11..11..10b | $2^n-1$<br>11..11..11b |
|---|---|---|---|---|---|---|---|
| 0<br>00..00.00b | 0<br>0 00..00..00b | 1<br>0 00..00..01b | ... | $2^{n-1}-1$<br>0 01..11..11b | ... | $2^n-2$<br>0 11..11..10b | $2^n-1$<br>0 11..11..11b |
| 1<br>00..00.01b | 1<br>0 00..00..01b | 2<br>0 00..00..10b | ... | $2^{n-1}$<br>0 10..00..00b | ... | $2^n-1$<br>0 11..11..11b | $2^n$<br>1 00..00..00b |
| ... | ... | ... | ... | ... | ... | ... | ... |
| $2^{n-1}-1$<br>01..11..11b | $2^{n-1}-1$<br>0 01..11..11b | $2^{n-1}$<br>0 10..00..00b | ... | $2^n-2$<br>0 11..11..10b | ... | $2^n+2^{n-1}-2-1$<br>1 01..11..01b | $2^n+2^{n-1}-2$<br>1 01..11..10b |
| ... | ... | ... | ... | ... | ... | ... | ... |
| $2^n-2$<br>11..11..10b | $2^n-2$<br>0 11..11..10b | $2^n-1$<br>0 11..11..11b | ... | $2^n+2^{n-1}-2-1$<br>1 01..11..01b | ... | $2^{n+1}-4$<br>1 11..11..00b | $2^{n+1}-2-1$<br>1 11..11..01b |
| $2^n-1$<br>11..11..11b | $2^n-1$<br>0 11..11..11b | $2^n$<br>1 00..00..00b | ... | $2^n+2^{n-1}-2$<br>1 01..11..10b | ... | $2^{n+1}-2-1$<br>1 11..11..01b | $2^{n+1}-2$<br>1 11..11..10b |

Fig. 6 n-bit by n-bit Subtraction Table : C = A - B

| B \ A | 0<br>00..00..00b | 1<br>00..00..01b | ... | $2^{n-1}-1$<br>01..11..11b | ... | $2^{n-2}$<br>11..11..10b | $2^n-1$<br>11..11..11b |
|---|---|---|---|---|---|---|---|
| 0<br>00..00..00b | 0<br>0 00..00..00b | 1<br>0 00..00..01b | ■■■ | $2^{n-1}-1$<br>0 01..11..11b | ■■■ | $2^n-2$<br>1 11..11..10b | $2^n-1$<br>0 11..11..11b |
| 1<br>00..00..01b | -1<br>1 00..00..01 | 0<br>0 00..00..00b | ■■■ | $2^{n-1}-2$<br>0 10..00..00b | ■■■ | $2^n-3$<br>0 11..11..11b | $2^n-2$<br>1 00..00..00b |
| ■■■ | ■■■ | ■■■ | ■■■ | ■■■ | ■■■ | ■■■ | ■■■ |
| $2^{n-1}-1$<br>01..11..11b | $-(2^{n-1}-1)$<br>1 01..11..11b | $2-2^{n-1}$<br>1 01..11..11b | ■■■ | 0<br>0 00..00..00b | ■■■ | $2^{n-2n-1}-1$<br>0 01..11..11b | $2^{n-2n-1}$<br>0 10..00..00b |
| ■■■ | ■■■ | ■■■ | ■■■ | ■■■ | ■■■ | ■■■ | ■■■ |
| $2^{n-2}$<br>11..11..10b | $-(2^n-2)$<br>1 11..11..10b | $-(2^n-3)$<br>1 11..11..11b | ■■■ | $-(2^n-2^{n-1}-1)$<br>1 10..00..11b | ■■■ | 0<br>1 00..00..00b | 1<br>0 00..00..01b |
| $2^n-1$<br>11..11..11b | $-(2^n-1)$<br>1 11..11..11b | $-(2^n-2)$<br>1 11..11..10b | ■■■ | $-(2^n-2^{n-1})$<br>1 10..00..00b | ■■■ | -1<br>1 00..00..01b | 0<br>0 00..00..00b |

"0" : + positive
"1" : - negative

Fig. 7

| A\B | 0<br>0000<br>0h | 1<br>0001<br>1h | ... | 6<br>0110<br>6h | 7<br>0111<br>7h | ... | 14<br>1110<br>eh | 15<br>1111<br>fh |
|---|---|---|---|---|---|---|---|---|
| 0<br>0000<br>0h | 0<br>00h | 0<br>00h | ... | 0<br>00h | 0<br>00h | ... | 0<br>00h | 0<br>00h |
| 1<br>0001<br>1h | 0<br>00h | 1<br>01h | ... | 6<br>06h | 7<br>07h | ... | 14<br>0eh | 15<br>0fh |
| ... | ... | ... | ... | ... | ... | ... | ... | ... |
| 6<br>0110<br>6h | 0<br>00h | 6<br>06h | ... | 36<br>24h | 42<br>2ah | ... | 54<br>36h | 90<br>5ah |
| 7<br>0111<br>7h | 0<br>00h | 7<br>07h | ... | 42<br>2ah | 49<br>21h | ... | 98<br>62h | 105<br>69h |
| ... | ... | ... | ... | ... | ... | ... | ... | ... |
| 14<br>1110<br>eh | 0<br>00h | 14<br>0eh | ... | 84<br>54h | 98<br>62h | ... | 196<br>c4h | 210<br>d2h |
| 15<br>1111<br>fh | 0<br>00h | 15<br>0fh | ... | 90<br>5ah | 105<br>69h | ... | 210<br>d2h | 225<br>e1h |

4-bit by 4-bit Multiplication Table : C = A x B

Fig. 11

| A\B | 0<br>0000b | 1<br>0001b | ... | 6<br>0110b | 7<br>0111b | ... | 14<br>1110b | 15<br>1111b |
|---|---|---|---|---|---|---|---|---|
| 0<br>0000b | 0<br>0 0000b | 1<br>0 0001b | ... | 6<br>0 0110b | 7<br>0 0111b | ... | 14<br>0 1110b | 15<br>0 1111b |
| 1<br>0001b | 1<br>0 0001b | 2<br>0 0010b | ... | 7<br>0 0111b | 8<br>0 1000b | ... | 15<br>0 1111b | 16<br>1 0000b |
| ... | ... | ... | ... | ... | ... | ... | ... | ... |
| 6<br>0110b | 6<br>0 0110b | 7<br>0 0111b | ... | 12<br>0 1100b | 13<br>0 1101b | ... | 20<br>1 0100b | 21<br>1 0101b |
| 7<br>0111b | 7<br>0 0111b | 8<br>0 1000b | ... | 13<br>0 1101b | 14<br>0 1110b | ... | 21<br>1 0101b | 22<br>1 0110b |
| ... | ... | ... | ... | ... | ... | ... | ... | ... |
| 14<br>1110b | 14<br>0 1110b | 15<br>0 1111b | ... | 20<br>1 0100b | 21<br>1 0101b | ... | 28<br>1 1100b | 29<br>1 1101b |
| 15<br>1111b | 15<br>0 1111b | 15<br>1 0000b | ... | 21<br>1 0101b | 22<br>1 0110b | ... | 29<br>1 1101b | 30<br>1 1110 |

4-bit by 4-bit Addition Table : C = A + B

Fig. 12

4-bit by 4-bit Subtraction Table : C = A - B

| A / B | 0<br>0000b | 1<br>0001b | ... | 6<br>0110b | 7<br>0111b | ... | 14<br>1110b | 15<br>1111b |
|---|---|---|---|---|---|---|---|---|
| 0<br>0000b | 0<br>0 0000b | 1<br>0 0001b | ... | 6<br>0 0110b | 7<br>0 0111b | ... | 14<br>0 1110b | 15<br>0 1111b |
| 1<br>0001b | -1<br>1 0001b | 0<br>0 0000 | ... | 5<br>0 0101b | 6<br>0 0110b | ... | 13<br>0 1101b | 14<br>1 1110b |
| ... | ... | ... | ... | ... | ... | ... | ... | ... |
| 6<br>0110b | -6<br>1 0110b | -5<br>1 0101b | ... | 0<br>0 0000b | 1<br>0 0001b | ... | 8<br>0 1000b | 7<br>0 0111b |
| 7<br>0111b | -7<br>1 0111b | -6<br>1 0110b | ... | -1<br>1 0001b | 0<br>0 0000b | ... | 7<br>0 0111b | 8<br>1 1000b |
| ... | ... | ... | ... | ... | ... | ... | ... | ... |
| 14<br>1110b | -14<br>1 1110b | -13<br>1 1101b | ... | -8<br>1 1000b | -7<br>1 0111b | ... | 0<br>0 0000b | 1<br>1 1101b |
| 15<br>1111b | -15<br>1 1111b | -14<br>1 1110b | ... | -9<br>1 1001b | -8<br>1 1000b | ... | -1<br>1 0001b | 0<br>1 1110 |

Fig. 13

IN-MEMORY ARITHMETIC PROCESSORS

BACKGROUND OF THE INVENTION

Field of the Invention

The invention is related to innovative arithmetic memory processors with no computing iterations. In particular, the in-memory arithmetic processors process binary numbers in one-step with the built-in arithmetical tables with no multiple-steps of binary code manipulations. The processing efficiencies of the in-memory arithmetic processors are dramatically improved in terms of data traffics and power consumptions. The in-memory arithmetic processors can be implemented by semiconductor memory arrays for the compactness in IC (Integrated Circuit) chip.

Description of the Related Art

In the modern Von Neumann computing architecture as shown in FIG. 1, the Central Process Unit (CPU) 10 executes logic operations according to the instructions and data from the main memory. The CPU 10 includes a main memory 11, an arithmetic and logic unit 12, input/output equipment 13 and a program control unit 14. Prior to the computation process, the CPU 10 is set by the program control unit 12 to point to the initial address code for the initial instruction in the main memory. The digital data are then processed with the arithmetic and logic unit 12 according to the sequential instructions in the main memory 11 accessed by the clock-synchronized address pointer in the program control unit 12. In general, the digital logic computation process for the CPU 10 is synchronously executed and driven by a set of pre-written sequential instructions stored in the memory.

In Von Neumann computer systems, the numbers are represented in the binary formats. For example, an integer number I in the n-bit format is given by $$I = b_{n-1}2^{n-1} + b_{n-2}2^{n-2} + \ldots + b_1 2^1 + b_0 := (b_{n-1}b_{n-2} \ldots b_1 b_0),$$

where $b_i = [0, 1]$ for $i = 0, \ldots, (n-1)$.

The arithmetic operations such as multiplication, addition, subtraction, and division for integer numbers require manipulating the binary strings of the operant binary integer numbers to obtain the correct representation of the resultant binary integer number. The manipulations of the binary strings include feeding into the various combinational logic gates and placing bits in the correct positions of the registers in IC chips. The binary codes for the integer numbers stored in data memory units moving in and out of the various logic units and binary registers are controlled by the sequential instructions also in the format of binary codes stored in instruction memory unit for the whole arithmetic computation process. Usually the more manipulation steps to move the inputted binary data strings in-out of various memory units and registers, and combinational logic units through their connecting bus-lines for the resultant binary string the more computing power is consumed. Specially, when the computing processor comes down to the single-bit level of manipulations of data strings, the power consumptions from the charging and discharging the capacitances of bus-lines, logic gates, and the gates of registers and memories will significantly increase with the increasing steps of operations as the power $P \sim f^*C^*V_{DD}^2$, where f is a clock cycle, C is the total charging/discharging capacitances for the computing process, and $V_{DD}$ is the high voltage supply. For example, the multiplication for two n-bit strings are usually done by the so-called bit multiply-accumulation sequence: starting with each single-bit of one n-bit operand multiplying (AND operation) the other n-bit operand to obtain the "n" n-bit strings; shifting the "n" n-bit strings into the correct positions of the "n" rows of 2n-bit long registers; filling the empty registers in the 2n-bit long registers with zeros; operating the "n" steps of additions (2n-bit string additions) for the "n" 2n-bit long strings to obtain the resultant binary 2n-bit string. The tedious steps of bit-level manipulations increase the loading of computing processors. The heavy traffics of the data strings moving in and out of the memory units, logic gates, and registers may also create the bus-line congestions for the computation-intensive processors. The so-called Von-Neumann bottle-neck due to the bus-line congestions of heavy data traffics is the main reason for slowing down the computation efficiency. Meanwhile, due to the more operational steps to complete the computations, the more memory storage spaces for the instruction codes are required for the computing process.

In this invention, we apply the arithmetic tables to eliminate the tedious bit-level manipulation steps into one-step bit-string processing to improve the computation efficiency and to save the computing power. It is similar to a human to improve his/her arithmetic capability by memorizing the multiplication table, the addition table, and the subtraction table in the familiar decimal format as respectively shown in FIGS. 2, 3, and 4. To implement the arithmetic tables in silicon hardware, we store the resultant binary codes from the arithmetic tables in memory arrays according to the arithmetic table values. For performing the block computations from the memory arrays, we apply the two-dimensional array operations for the two-variable inputs by pointing to the correspondent row and column cell in the memory array to output the resultant binary code in response to the row and column cell of the arithmetic tables.

SUMMARY OF THE INVENTION

FIG. 5 shows the n-bit by n-bit multiplication table with $2^n*2^n$ table cells. Each cell in the table contains an integer number in the decimal format (upper) and the binary format (lower). The cells in first row from the top of the n-bit by n-bit multiplication table are filled with the sequential integer number indexes starting from 0, 1, 2, . . . , $(2^{n-1}-1)$, . . . , $(2^n-2)$, to $(2^n-1)$, that is, A: 0/(00..00..00b), 1/(00..00..01b), 2/(00..00..10b), . . . , $(2^{n-1}-1)/(01..11..11b)$, . . . , $(2^n-2)/(11..11..10b)$, $(2^n-1)/(11..11..11b)$ for the first row of cells. The cells in first column from the left of the n-bit by n-bit multiplication table are filled with the sequential integer number indexes starting from 0, 1, 2, . . . , $(2^{n-1}-1)$, . . . , $(2^n-2)$, to $(2^n-1)$, that is, B: 0/(00..00..00b), 1/(00..00..01b), 2/(00..00..10b), . . . , $(2^{n-1}-1)/(01..11..11b)$, . . . , $(2^n-2)/(11..11..10b)$, $(2^n-1)/(11..11..11b)$ for the first column of cells. The multiplication number $C = A*B = (p-2)*(q-2)$, as written in the decimal format/binary format: $(p*q-2*p-2*q+4)/(xx..xx..xx xx..xx..xxb)$, are filled in the $p^{th}$-column and $q^{th}$-row cell, for p, q = [2, 3, 4, . . . , $2^{n+1}$]. Note that the multiplication of two "n-bit" integers obtains the resultant integer number with 2n-bit long. For example, for the second column A=0 and the third row B=1, the multiplication number $C = A*B = 0*1 = 0$ with its 2n-bit representation: (00..00..00 00..00..00b), as written in 0/(00..00..00 00..00..00b), are filled in the second column and third row cell. For the $A = (2^n-1)$ and $B = (2^{n-1}-1)$, the multiplication number $C = A*B = (2^n-1)*(2^{n-1}-1) = (2^{2n}-2^n-2^{n-1}+1)$ and its 2n-bit representation: (01..11..10

10..00..01b), as written in $(2^{2n}-2^n-2n-1+1)/(01..11..10$ 10..00..01b), are filled in the $(2^n+1)^{th}$-column and $(2^{n-1}+1)^{th}$-row cell, and so forth for the rest of other cells in the table.

FIG. 6 shows the n-bit by n-bit addition table with $2^n*2^n$ table cells. Each cell in the table contains an integer number in the decimal format (upper) and the binary format (lower). The cells in first row from the top of the n-bit by n-bit addition table are filled with the sequential integer number indexes starting from $0, 1, 2, \ldots, (2^{n-1}-1), \ldots, (2^n-2)$, to $(2^n-1)$, that is, A: 0/(00..00..00b), 1/(00..00..01b), 2/(00..00..10b), ..., $(2^{n-1}-1)$/(01..11..11b), ..., $(2^n-2)$/(11..11..10b), $(2^n-1)$/(11..11..11b) for the first row of cells. The cells in first column from the left of the n-bit by n-bit addition table are filled with the sequential integer number indexes starting from $0, 1, 2, \ldots, (2^{n-1}-1), \ldots, (2^n-2)$, to $(2^n-1)$, that is, B: 0/(00..00..00b), 1/(00..00..01b), 2/(00..00..10b), ..., $2^{n-1}-1$/(01..11..11b), ..., $(2^n-2)$/(11..11..10b), $(2^n-1)$/(11..11..11b) for the first column of cells. The addition number C=A+B=(p−2)+(q−2) as written in the decimal format/binary format: (p+q−4)/(x xx..xx..xxb), are filled in the $p^{th}$-column and $q^{th}$-row cell, for p, q=[2, 3, 4, ..., $2^n+1$]. Note that the "n+1"-bit representation includes an extra carry-over bit on the left for the two "n-bit" integer addition. For example, for the second column A=0 and the third row B=1, the addition number C=A+B=0+1=1 with its "n+1"-bit representation: 1/(0 00..00..01b) are filled in the second-column and third-row cell. For the A=$(2^n-1)$ and B=$(2^{n-1}-1)$, the addition number C=A+B= $(2^n-1)+(2^{n-1}-1)=(2^n-2^{n-1}-2)$ with its "n+1"-bit representation: $(2^n-2^{n-1}-2)$/(1 01..11..10b), are filled in the $(2^n+1)^{th}$-column and $(2^{n-1}+1)^{th}$-row cell, and so forth for the rest of other cells in the table.

FIG. 7 shows the n-bit by n-bit subtraction table with $2^n*2^n$ table cells. Each cell in the table contains an integer number (upper) in the decimal format and the binary format (lower). The cells in first row from the top of the n-bit by n-bit subtraction table are filled with the sequential integer number indexes starting from $0, 1, 2, \ldots, (2^{n-1}-1), \ldots, (2^n-2)$, to $(2^n-1)$, that is, A: 0/(00..00..00b), 1/(00..00..01b), 2/(00..00..10b), ..., $(2^{n-1}-1)$/(01..11..11b), ..., $(2^n-2)$/(11..11..10b), $(2^n-1)$/(11..11..11b) for the first row of cells. The cells in first column from the left of the n-bit by n-bit subtraction table are filled with the sequential integer number indexes starting from $0, 1, 2, \ldots, (2^{n-1}-1), \ldots, (2^n-2)$, to $(2^n-1)$, that is, B: 0/(00..00..00b), 1/(00..00..01b), 2/(00..00..10b), ..., $(2^{n-1}-1)$/(01..11..11b), ..., $(2^n-2)$/(11..11..10b), $(2^n-1)$/(11..11..11b) for the first column of cells. The subtraction number C=A−B=(p−2)−(q−2) as written in the decimal format/binary format: (p−q)/(x xx..xx..xxb), are filled in the $p^{th}$-column and $q^{th}$-row cell, for p, q=[2, 3, 4, ..., $2^n+1$]. Note that a "n+1"-bit representation includes a "sign" bit on the left defined as "1" negative and "0" positive for the two "n-bit" integer subtraction. For example, for the second column A=0 and the third row B=1, the subtraction number C=A−B=0−1=−1 with its "n+1"-bit representation: (−1)/(1 00..00..01b) are filled in the second-column and third-row cell. For the A=$2^n-1$ and B=$2^{n-1}-1$, the subtraction number C=A−B=$(2^n-1)-(2^{n-1}-1)=(2^n-2^{n-1})$ with its "n+1"-bit representation: $(2^n-2^{n-1})$/(0 10..00..00b), are filled in the $(2^n+1)^{th}$-column and $(2^{n-1}+1)^{th}$-row cell, and so forth for the rest of other cells in the table.

To implement the binary arithmetic tables (multiplication, addition, and subtraction in FIGS. 5, 6, and 7) in silicon hardware, an in-memory arithmetic processor 800 of the invention includes an n-bit "B" register 810, an n-bit "A" register 820, two n-bit decoders 811 and 821, a Wordline Driver 812, a Y-Switch Driver 822, a memory array 850, a Y-Switch 830, and an m-bit Output "C" register 840 as the schematics shown in FIG. 8.

For any two n-bit inputted integers A=$a_{n-1}a_{n-2}..a_i..a_1a_0$b (binary) and B=$b_{n-1}b_{n-2}..b_i..b_1b_0$b (binary), for each $a_i$, $b_j$=[0,1] the voltage signals, $V_{DD}$ for "1" and $V_{SS}$ for "0", from the n-bit "A" register 820 and the n-bit "B" register 810 are simultaneously fed into the n-bit decoder 821 and the n-bit decoder 811, respectively. The n-bit decoders 821 and 811 decode to activate the high voltage signal $V_{DD}$ on the only selected $YS_i$ node and the only selected $XS_j$ node for i, j=[0,1, ..., $2^n-1$] according to the inputted codes A and B. The voltage signal $V_{DD}$ on the selected $YS_i$ node and the voltage signal $V_{DD}$ on the selected $XS_j$ node through the Y-Switch Driver 822 and the Wordline Driver 812 are respectively applied to drive the selected Y-switch $BS_i$ and the selected wordline $W_j$. The activated wordline $W_j$ is then applied to $j^{th}$ row so as to turn on the entire $j^{th}$ row of $2^n$ cells for accessing the codes stored in the entire $j^{th}$ row of $2^n$ cells in the memory array 850; since the other wordlines are deactivated, the cells in the other rows of the memory array 850 are turned off. Meanwhile by connecting bitlines 85BL to the Y-Switch 830, the selected bitline switch $BS_i$ is only activated to pass the voltage signals of the $i^{th}$ column cell in the entire $j^{th}$ row cells in the memory array 850 through the cell bus-lines 83BL to the m-bit Output "C" register 840; since the other bitline switches are deactivated, the voltage signals of the cells in other columns in the $j^{th}$ row of the memory array 850 are forbidden to pass. The m-bit Output "C" register 840 is used to temporarily store a m-bit code pre-stored in the $i^{th}$ column cell in the $j^{th}$ row cells in the memory array 850.

For the case of two n-bit multiplication, we apply the n-bit by n-bit multiplication table in FIG. 5 for the resultant codes stored in each memory cell 85*ij*. Each memory cell 85*ij* for the n-bit by n-bit multiplication stores the 2n-bit long resultant code according to the binary code of the correspondent $(i+2)^{th}$-column and $(j+2)^{th}$-row cell in the n-bit by n-bit multiplication table in FIG. 5. Note that the number m=2*n for the two n-bit multiplication in the m-bit Output "C" register 840 is shown in FIG. 8.

For the case of two n-bit addition, we apply the n-bit by n-bit addition table in FIG. 6 for the resultant codes stored in the memory cell 85*ij*. Each memory cell 85*ij* for the n-bit by n-bit addition stores the (n+1)-bit long resultant code (including a carry-over bit) according to the binary code of the correspondent $(i+2)^{th}$-column and $(j+2)^{th}$-row cell in the n-bit by n-bit addition table in FIG. 6. Note that the number m=n+1 for the two n-bit addition in the m-bit Output "C" register 840 is shown in FIG. 8.

For the case of two n-bit subtraction, we apply the n-bit by n-bit subtraction table in FIG. 7 for the resultant codes stored in the memory cell 85*ij*. Each memory cell 85*ij* for the n-bit by n-bit subtraction stores an (n+1)-bit long resultant codes (including a "sign" bit) according to the binary code of the correspondent $(i+2)^{th}$-column and $(j+2)^{th}$-row cell in the n-bit by n-bit subtraction table in FIG. 7. Note that the number m=n+1 for the two n-bit subtraction in the m-bit Output "C" register 840 is shown in FIG. 8.

BRIEF DESCRIPTION OF THE DRAWINGS

For a better understanding of the present invention and to show how it may be carried into effect, reference will now be made to the following drawings, which show the preferred embodiment of the present invention, in which:

FIG. 2 shows the decimal multiplication table.

FIG. 3 shows the decimal addition table.

FIG. 4 shows the decimal subtraction table.

FIG. 5 shows the n-bit by n-bit multiplication table according to this invention.

FIG. 6 shows the n-bit by n-bit addition table according to this invention.

FIG. 7 shows the n-bit by n-bit subtraction table according to this invention.

FIG. 11 shows the 4-bit by 4-bit Multiplication Table according to an embodiment of the invention.

FIG. 12 shows the 4-bit by 4-bit Addition Table according to another embodiment of the invention.

FIG. 13 shows the 4-bit by 4-bit Subtraction Table according to another embodiment of the invention.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

To illustrate the main idea of the in-memory arithmetic processors 800, we apply a Read Only Memory (ROM) array for implementing the arithmetic tables in IC chips. Although the embodiment of the memory array 850 is described in terms of a ROM array, it should be understood that embodiments of the memory array 850 are not so limited, but are applicable to other types of memory arrays such as SRAM arrays, DRAM arrays, and Non-volatile RAM arrays.

Figure 9:
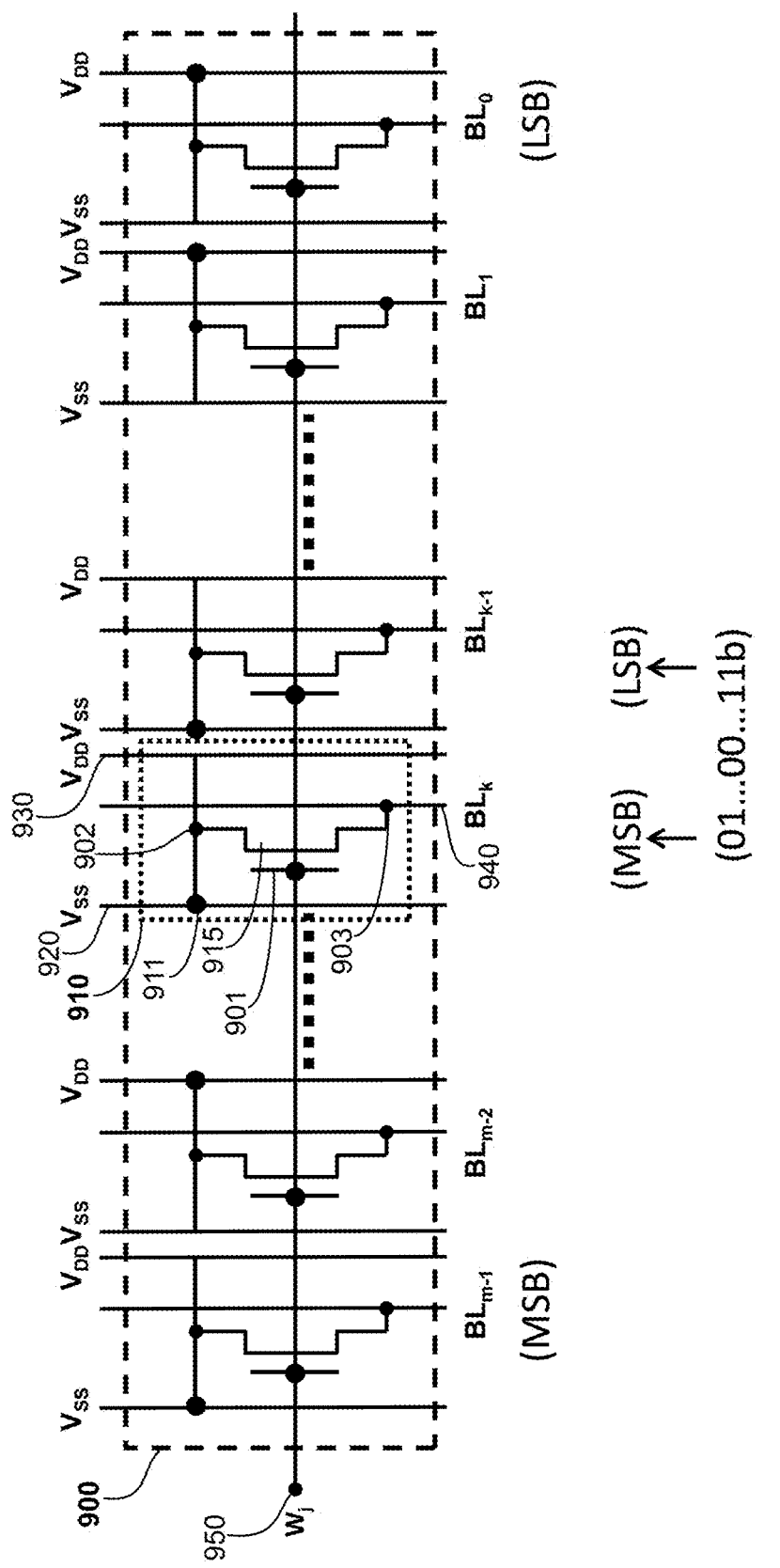
FIG. 9 shows the schematic of "m-bit" ROM cells for storing a resultant binary code according to an arithmetic table cell selected from the memory array 850 according to an embodiment of the invention.

In the embodiment, the schematic of the ROM array 850 including the cells 900 of the arithmetic table is shown in FIG. 9. The ROM array 850 includes $2^n$-column by $2^n$-row arithmetic table cells 900. Each arithmetic table cell 900 is represented by a row of "m" ROM cells 910 for storing the "m-bit" of resultant codes. Each ROM cell 910 comprises an N-type Metal Oxide Semiconductor Field Effect Transistor (NMOSFET) device 915, and two vertical metal lines 920 and 930 for applying digital voltages $V_{SS}$ and $V_{DD}$, and one vertical output metal bitline 940. The source electrodes 903 of "m" NMOSFET devices 915 in the row are connected to their vertical bitlines 940, respectively. The gates 901 of the row of the NMOSFET devices 915 are connected to form a horizontal wordline $W_j$ 950. The drain electrode 902 of NMOSFET device 915 is connected to either cell's $V_{SS}$ line 920 for "0" or Cell's $V_{DD}$ line 930 for "1" in each ROM cell 910 by a metal contact 911. For example, the row of the "m-bit" ROM cells 910 represents the binary code of (01 . . . 00 . . . 11 b) as illustrated in FIG. 9. When a wordline $W_j$ 950 of the ROM cells 910 is activated "high", the voltage signals of the entire row j of binary codes for $2^n$ sets of m-bit codes pass to the $2^n$ sets of "m" bitlines in the memory cell 850.

Figure 1:
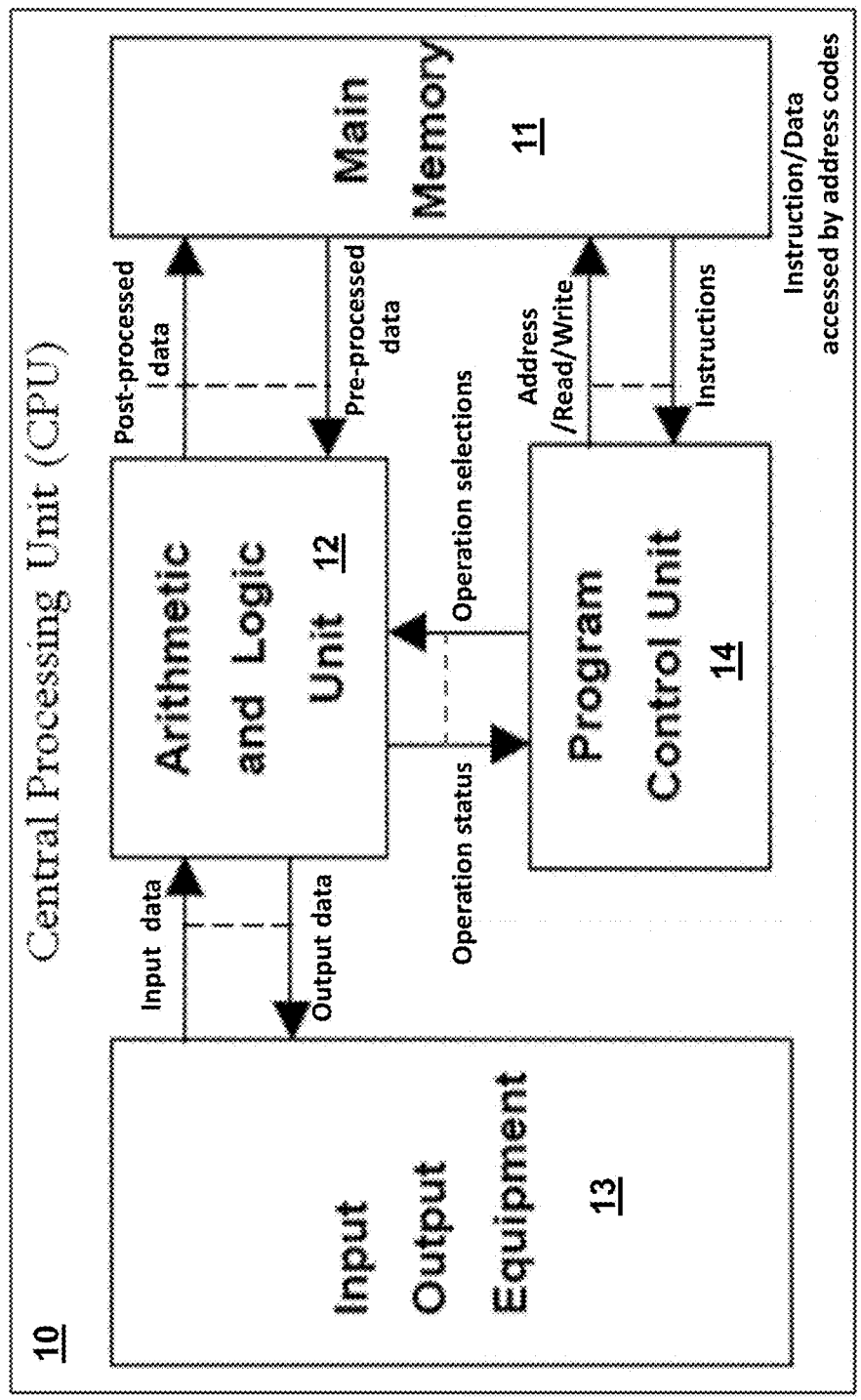
FIG. 1 shows the conventional Von-Neumann computing architecture for a typical Central Processing Unit (CPU).
Figure 8:
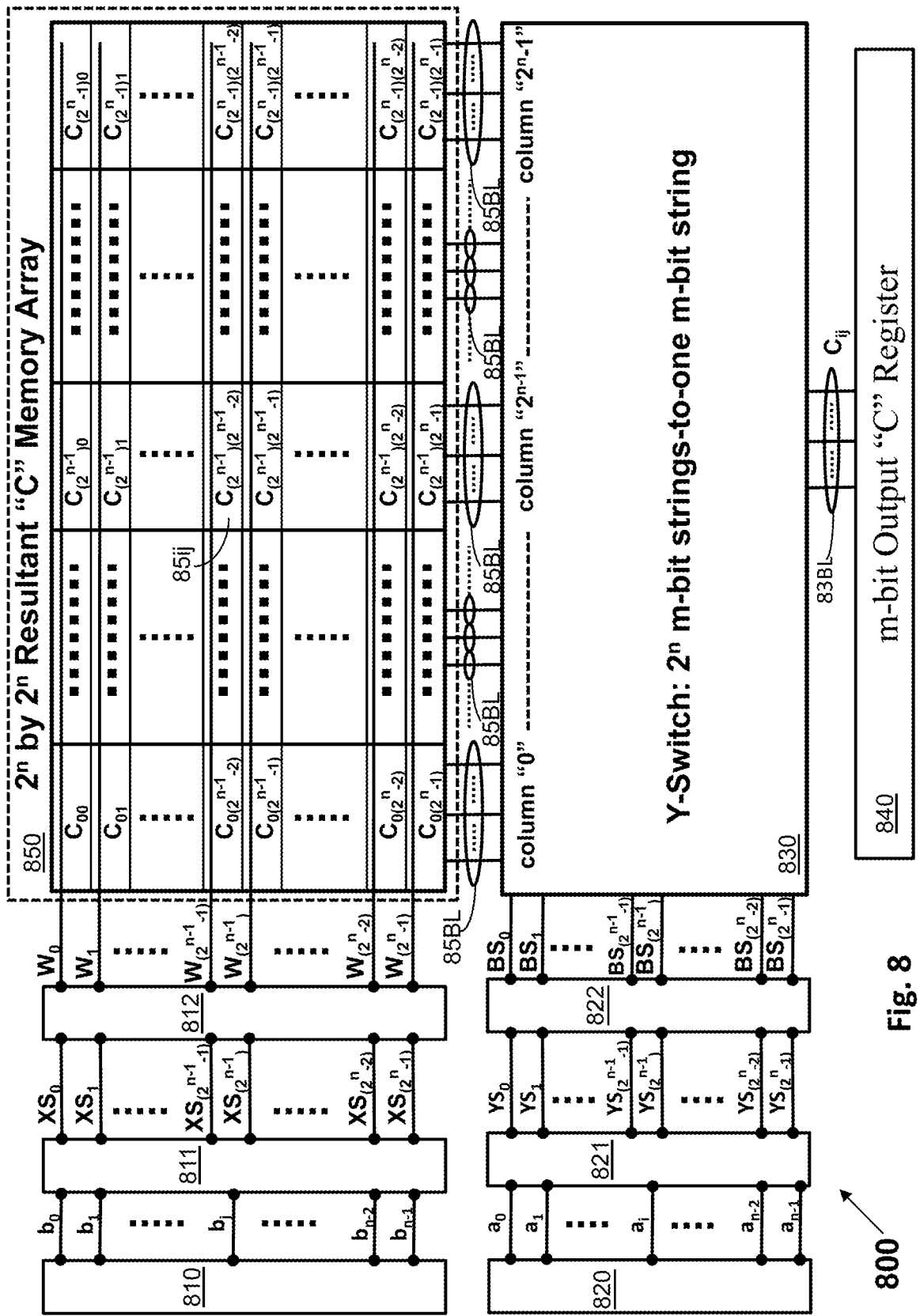
FIG. 8 shows the schematics of an in-memory arithmetic processor including a $2^n*2^n$ memory array with two "n-bit" registers, two "n-bit" decoders and two drivers for implementing the n-bit by n-bit arithmetic tables according to this invention.
Figure 10:
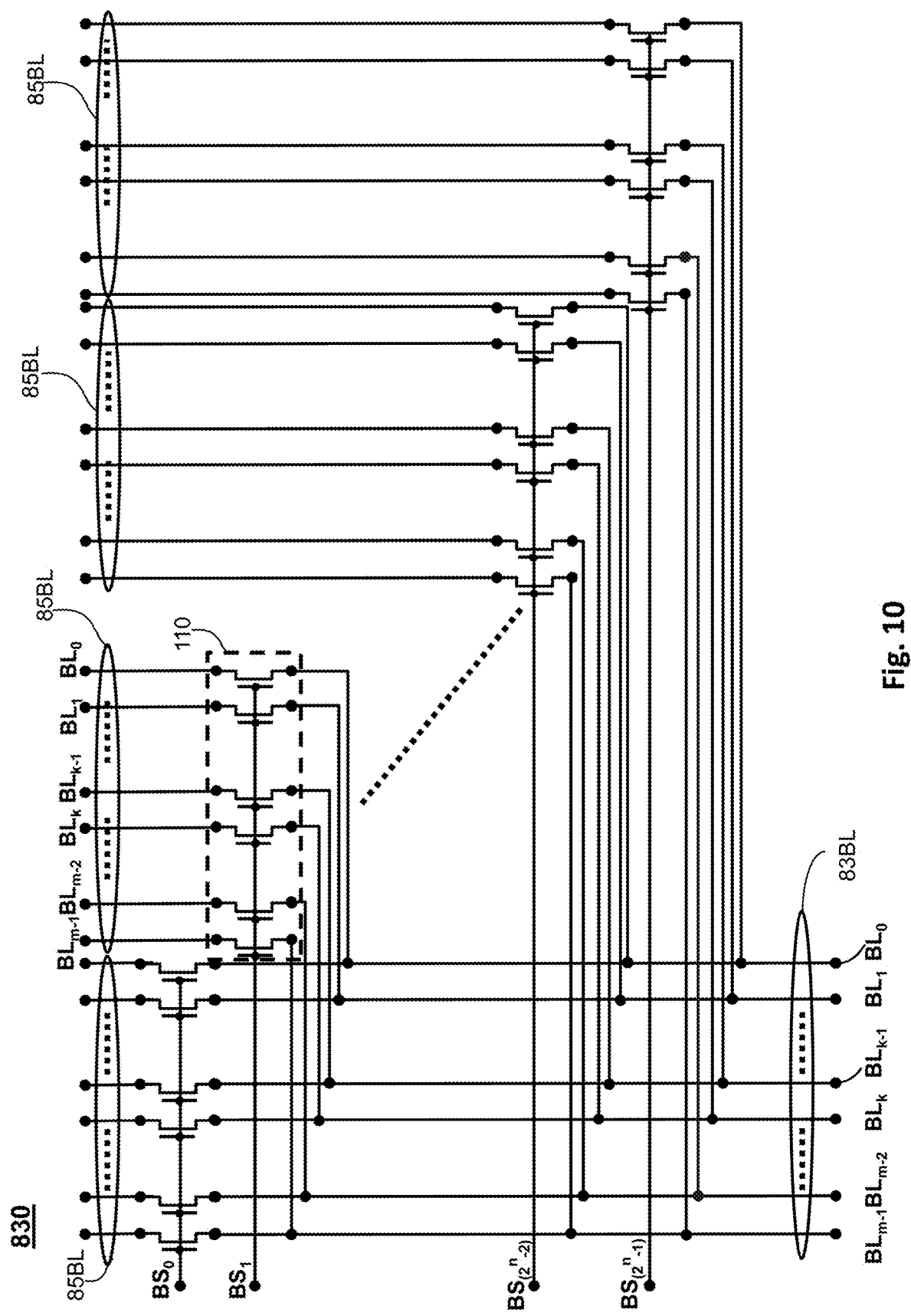
FIG. 10 shows the schematic of $2^n$ sets of Y-Switch for connecting a set of m-bit output bitlines to one of $2^n$ sets of m-bit input bitlines according to an embodiment of the invention.

Meanwhile the Y-Switch 830 comprises "$2^n$" sets of switches 110 as shown in FIG. 10. In FIG. 10, each set of switches 110 comprises "m" NMOSFET devices. The gates of the "m" NMOSFET devices of each switch set 110 are connected to form a bitline switch $BS_i$, which is connected to the Y-Switch Driver 822 for i=0, 1, . . . , ($2^n-1$) as shown in FIG. 8. When one of the bitline switches $BS_i$ is activated, a corresponding set of the "m" NMOSFET devices is turned on to connect a corresponding set of bitlines 85BL to the output bitlines 83BL to pass the resultant "m-bit" code $C_{ij}$ stored in the $(i+1)^{th}$ column and $(j+1)^{th}$ row cell of the memory array 850 for i, j=0, 1, . . . , ($2^n-1$). Since the schematics and the operations of the registers 810/820 for bit-storage, the bit decoders 811/821, the wordline driver 812 and the Y-switch driver 822 are well known to the people skilled in the art, we will not address in many details.

For the illustration purpose of using the conventional hexadecimal format, we will apply the 4-bit by 4-bit arithmetic operations for the embodiments (n=4). However, the numbers of bits for the arithmetic operation can be any integer number greater than 1. For the 4-bit by 4-bit multiplication, the resultant integer in the decimal format (upper) and its 8-bit representation in the hexadecimal format (lower) in each arithmetic table cell are shown in FIG. 11. According to the schematic in FIG. 8, we have the 4-bit decoder 821 decoding the 4-bit code A for the bitline switches of sixteen columns in the Y-switch 830 and the 4-bit decoder 811 decoding 4-bit code B for switching the wordlines of sixteen rows in the ROM array 850, and 16*16*8 ROM cells 910 of the ROM array 850. Every eight ROM cells 910 (m=8) in a row as illustrated in FIG. 9 stores the resultant 8-bit code C for the correspondent table cell of the 4-bit by 4-bit multiplication table in FIG. 11. Note the 8-bit code C represented in the hexadecimal format in the memory cell 85$ij$ is implemented by connecting one of $V_{DD}$ for "1 s" and $V_{SS}$ for "0s" to the drain electrode 902 of NMOSFET device 915 by a metal contact 911 in each individual ROM cell 910 shown in FIG. 9. For example, 2*3=6=(06h)=(0000 0110b) connects the voltage biases ($V_{SS}V_{SS}V_{SS}V_{SS}V_{SS}V_{DD}V_{DD}V_{SS}$) to the drain electrodes 902 of each NMOSFET devices 915 by metal contacts 911 in the eight ROM cells 910 from the left to right for the correspondent memory cell 85$ij$ for i, j=2, 3 (according to the binary code of the correspondent $4^{th}$-column and $5^{th}$-row cell in the 4-bit by 4-bit multiplication table in FIG. 11); 7*15=105=(69h)=(0110 1001 b) connects the voltage biases ($V_{SS}V_{DD}V_{DD}V_{SS}V_{DD}V_{SS}V_{SS}V_{DD}$) to the drain electrodes 902 of each NMOSFET devices 915 by metal contacts 911 in the 8 ROM cells 910 from the left to right for the correspondent memory cell 85$ij$ for i, j=7, 15 (according to the binary code of the correspondent $9^{th}$-column and $17^{th}$-row cell in the 4-bit by 4-bit multiplication table in FIG. 11); 15*15=225=(e1h)=(1110 0001b) connects the voltage biases ($V_{DD}V_{DD}V_{DD}V_{SS}V_{SS}V_{SS}V_{SS}V_{DD}$) to the drain electrodes 902 of NMOSFET devices 915 by metal contacts 911 in the eight ROM cells 910 from the left to right for the correspondent memory cell 85ij for i, j=15, 15 (according to the binary code of the correspondent $17^{th}$-column and $17^{th}$-row cell in the 4-bit by 4-bit multiplication table in FIG. 11), and so forth for the rest of ROM cells 910.

For the 4-bit by 4-bit addition, the resultant integer in the decimal format (upper) and its 5-bit representation (m=5) in the binary format (lower) in each table cell are shown in FIG. 12. According to the schematic in FIG. 8, we have the 4-bit decoder 821 decoding the 4-bit code A for the bitline switches of sixteen columns in the Y-switch 830 and the 4-bit decoder 811 decoding the 4-bit code B for switching the wordlines of sixteen rows in the ROM array 850 and 16*16*5 ROM cells 910 of the ROM array 850. Every five ROM cells 910 in a row as illustrated in FIG. 9 stores the resultant 5-bit code C including a "carry-over bit" for the correspondent table cell of the 4-bit by 4-bit addition table in FIG. 12. Note the 5-bit code C represented in the binary format in the memory cell 85ij is implemented by connecting either $V_{DD}$ for "1 s" or $V_{SS}$ for "0s" to the drain electrodes 902 of NMOSFET devices 915 by metal contacts 911 in the ROM cells 910 shown in FIG. 9. For example, 2+3=5=(0 0101b) connects the voltage biases ($V_{SS}V_{SS}V_{DD}V_{SS}V_{DD}$) to the electrodes 902 of NMOSFET devices 915 by metal contacts 911 in the five ROM cells from the left to right for the correspondent memory cell 85ij for i, j=2, 3 (according to the binary code of the correspondent $4^{th}$-column and $5^{th}$-row cell in the 4-bit by 4-bit addition table in FIG. 12); 7+15=12=(0 1100b) connects the voltage biases ($V_{SS}V_{DD}V_{DD}V_{SS}V_{SS}$) to the drain electrodes 902 of NMOSFET devices 915 in the five ROM cells from the left to right for the correspondent memory cell 85ij for i, j=7, 15 (according to the binary code of the correspondent $9^{th}$-column and $17^{th}$-row cell in the 4-bit by 4-bit addition table in FIG. 12); 15+15=30=(1 1110b) connects the voltage biases ($V_{SS}V_{DD}V_{DD}V_{SS}V_{SS}$) to the drain electrodes 902 of NMOSFET devices 915 by metal contacts 911 in the five ROM cells 910 from the left to right for the correspondent memory cell 85ij for i, j=15, 15 (according to the binary code of the correspondent $17^{th}$-column and $17^{th}$-row cell in the 4-bit by 4-bit addition table in FIG. 12), and so forth for the rest of ROM cells 910.

For the 4-bit by 4-bit subtraction, the resultant integer in the decimal format (upper) and its 5-bit representation (m=5) in the binary format in each table cell are shown in FIG. 13. According to the schematic in FIG. 8, we have the 4-bit decoder 821 decoding the 4-bit code A for the bitline switches of sixteen columns in the Y-switch 830 and the 4-bit decoder 811 decoding 4-bit code B for switching the wordlines of sixteen rows in the ROM array 850, and 16*16*5 ROM cells 910 of the ROM array 850. Every five ROM cells 910 in a row as illustrated in FIG. 9 stores the resultant 5-bit code C including a "sign" bit for the correspondent table cell of the 4-bit by 4-bit addition table in FIG. 13. Note the 5-bit code C represented in the binary format in the memory cell 85ij is implemented by connecting either $V_{DD}$ for "1 s" or $V_{SS}$ for "0s" to the drain electrodes 902 of NMOSFET devices 915 by metal contacts 911 in the ROM cells 910 shown in FIG. 9. For example, 2−3=−1=(1 0001b) connects the voltage biases ($V_{DD}V_{SS}V_{SS}V_{SS}V_{DD}$) to the electrodes 902 of NMOSFET devices 915 by metal contacts 911 in the five ROM cells from the left to right for the correspondent memory cell 85ij for i, j=2, 3 (according to the binary code of the correspondent $4^{th}$-column and $5^{th}$-row cell in the 4-bit by 4-bit subtraction table in FIG. 13); 15-7=8=(0 1000b) connects the voltage biases ($V_{SS}V_{DD}V_{SS}V_{SS}V_{SS}$) to the electrodes 902 of NMOSFET devices 915 by metal contacts 911 in the five ROM memory cells from the left to right for the correspondent memory cell 85ij for i, j=15, 7 (according to the binary code of the correspondent $17^{th}$-column and $9^{th}$-row cell in the 4-bit by 4-bit subtraction table in FIG. 13); 15-15=30=(0 0000b) connects the voltage biases ($V_{SS}V_{SS}V_{SS}V_{SS}V_{SS}$) to the electrodes 902 of NMOSFET devices 915 by metal contacts 911 in the five ROM memory cells from the left to right for the correspondent memory cell 85ij for i, j=15, 15 (according to the binary code of the correspondent $17^{th}$-column and $17^{th}$-row cell in the 4-bit by 4-bit subtraction table in FIG. 13).

The aforementioned description of the preferred embodiments of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An in-memory arithmetic processor for receiving a first n-bit operand and a second n-bit operand of an arithmetic operation and generating a m-bit output number, the processor comprising:
    a memory array comprising memory cells arranged in p rows and q columns, pre-storing m-bit cell values of an arithmetic table used to define the arithmetic operation and generating a number q of m-bit cell values in response to an activated row driving signal associated with the second n-bit operand; and
    a column selector to select one from the number q of m-bit cell values in response to an activated column driving signal associated with the first n-bit operand to output the m-bit output number;
    wherein a number of the memory cells is associated with a number of the m-bit cell values;
    wherein each memory cell comprises a number m of unit cells in a row, wherein each unit cell comprises:
    a vertical first metal line connected to a digital voltage;
    a vertical second metal line connected to a ground node;
    a vertical metal bit line; and
    a first NMOS device, a source electrode of which is connected to the vertical metal bit line and a drain electrode of which is connected to one of the vertical first metal line and the vertical second metal line according to its corresponding bit value;

wherein gate electrodes of the first NMOS devices in a row are connected together to form one of p wordlines in the memory array and receive its corresponding row driving signal.

2. The processor according to claim 1, further comprising:
a first input circuitry to activate one of q column driving signals according to the first n-bit operand to respectively apply the activated column driving signal and (q-1) deactivated column driving signals to the column selector; and
a second input circuitry to activate one of p row driving signals according to the second n-bit operand to respectively apply the activated row driving signal and (p-1) deactivated row driving signals to p wordlines of the memory array.

3. The processor according to claim 2, wherein the first input circuitry comprises:
a first input register for storing the first n-bit operand;
a first decoder connected to the first input register and having $2^n$ first output nodes, wherein the first decoder activates one of the $2^n$ first output nodes according to the first n-bit operand; and
a column driver connected to the first decoder and supplying the activated column driving signal and the (q-1) deactivated column driving signals to the column selector according to the activated first output node.

4. The processor according to claim 2, wherein the second input circuitry comprises:
a second input register for storing the second n-bit operand;
a second decoder connected to the second input register and having $2^n$ second output nodes, wherein the second decoder activates one of the $2^n$ second output nodes according to the second n-bit operand; and
a wordline driver connected to the second decoder and supplying the activated row driving signal and the (p-1) deactivated row driving signals to the p wordlines of the memory array according to the activated second output node.

5. The processor according to claim 1, wherein the column selector comprises q switches,
and each switch comprises a number m of second NMOS devices in a row, and wherein gate electrodes of the second NMOS devices in a row are connected together to receive its corresponding column driving signal.

6. The processor according to claim 1, further comprising:
an output register for storing the m-bit output number.

7. The processor according to claim 1, wherein the memory array is selected from the group comprising a SRAM array, a DRAM array, a ROM array and an nonvolatile RAM array.

8. An in-memory arithmetic processor for receiving a first n-bit operand and a second n-bit operand of an arithmetic operation and generating a m-bit output number, the processor comprising:
a memory array comprising memory cells arranged in p rows and q columns, pre-storing m-bit cell values of an arithmetic table used to define the arithmetic operation and generating a number q of m-bit cell values in response to an activated row driving signal associated with the second n-bit operand; and
a column selector to select one from the number q of m-bit cell values in response to an activated column driving signal associated with the first n-bit operand to output the m-bit output number;

wherein a number of the memory cells is associated with a number of the m-bit cell values;
wherein each memory cell pre-stores a corresponding m-bit cell value in the arithmetic table with a size of $2^n*2^n$, wherein if the arithmetic operation is a multiplication operation, the arithmetic table is a multiplication table and m=2*n, wherein if the arithmetic operation is an addition operation, the arithmetic table is an addition table and m=n+1, and wherein if the arithmetic operation is a subtraction operation, the arithmetic table is a subtraction table and m=n+1.

9. The processor according to claim 8, further comprising:
a first input circuitry to activate one of q column driving signals according to the first n-bit operand to respectively apply the activated column driving signal and (q-1) deactivated column driving signals to the column selector; and
a second input circuitry to activate one of p row driving signals according to the second n-bit operand to respectively apply the activated row driving signal and (p-1) deactivated row driving signals to p wordlines of the memory array.

10. The processor according to claim 9, wherein the first input circuitry comprises:
a first input register for storing the first n-bit operand;
a first decoder connected to the first input register and having $2^n$ first output nodes, wherein the first decoder activates one of the $2^n$ first output nodes according to the first n-bit operand; and
a column driver connected to the first decoder and supplying the activated column driving signal and the (q-1) deactivated column driving signals to the column selector according to the activated first output node.

11. The processor according to claim 9, wherein the second input circuitry comprises:
a second input register for storing the second n-bit operand;
a second decoder connected to the second input register and having $2^n$ second output nodes, wherein the second decoder activates one of the $2^n$ second output nodes according to the second n-bit operand; and
a wordline driver connected to the second decoder and supplying the activated row driving signal and the (p-1) deactivated row driving signals to the p wordlines of the memory array according to the activated second output node.

12. The processor according to claim 8, wherein the column selector comprises q switches, and each switch comprises a number m of second NMOS devices in a row, and wherein gate electrodes of the second NMOS devices in a row are connected together to receive its corresponding column driving signal.

13. The processor according to claim 8, further comprising:
an output register for storing the m-bit output number.

14. The processor according to claim 8, wherein the memory array is selected from the group comprising a SRAM array, a DRAM array, a ROM array and an nonvolatile RAM array.

15. An in-memory arithmetic processing method for receiving a first n-bit operand and a second n-bit operand of an arithmetic operation and generating a m-bit output number, the method comprising:
pre-storing m-bit cell values of an arithmetic table used to define the arithmetic operation by a memory array comprising memory cells arranged in p rows and q columns;

generating a number q of m-bit cell values by the memory array in response to an activated row driving signal associated with the second n-bit operand; and selecting one from the number q of m-bit cell values by a column selector comprising q switches in response to an activated column driving signal associated with the first n-bit operand to output the m-bit output number;

wherein a number of the memory cells is associated with a number of the m-bit cell values;

wherein each memory cell pre-stores a corresponding m-bit cell value in the arithmetic table with a size of $2^n*2^n$, wherein if the arithmetic operation is a multiplication operation, the arithmetic table is a multiplication table and m=2*n, wherein if the arithmetic operation is an addition operation, the arithmetic table is an addition table and m=n+1, and wherein if the arithmetic operation is a subtraction operation, the arithmetic table is a subtraction table and m=n+1.

16. The method according to claim 15, further comprising:

prior to the step of selecting and after the step of pre-storing, activating one of q column driving signals according to the first n-bit operand to respectively apply the activated column driving signal and (q-1) deactivated column driving signals to the q switches of the column selector.

17. The method according to claim 15, further comprising:

prior to the step of generating and after the step of pre-storing, activating one of p row driving signals according to the second n-bit operand to respectively apply the activated row driving signal and (p-1) deactivated row driving signals to p wordlines of the memory array.

18. The method according to claim 15, wherein the memory array is selected from the group comprising a SRAM array, a DRAM array, a ROM array and an non-volatile RAM array.

* * * * *